United States Patent
Usui et al.

(10) Patent No.: US 8,564,957 B2
(45) Date of Patent: Oct. 22, 2013

(54) COOLING STRUCTURE FOR ELECTRONIC EQUIPMENT

(75) Inventors: Masahiko Usui, Kawasaki (JP); Takafumi Enami, Hadano (JP); Sho Ikeda, Hadano (JP); Shigeyasu Tsubaki, Odawara (JP)

(73) Assignee: Hitachi, Ltd., Tokyo (JP)

( * ) Notice: Subject to any disclaimer, the term of this patent is extended or adjusted under 35 U.S.C. 154(b) by 190 days.

(21) Appl. No.: 12/960,962

(22) Filed: Dec. 6, 2010

(65) Prior Publication Data

US 2011/0228485 A1 Sep. 22, 2011

(30) Foreign Application Priority Data

Mar. 18, 2010 (JP) .................................. 2010-061782

(51) Int. Cl.
*H05K 7/20* (2006.01)

(52) U.S. Cl.
USPC ...... 361/720; 361/679.54; 361/704; 361/707; 361/715; 361/719; 165/80.3; 165/104.33; 165/185; 257/706; 257/707

(58) Field of Classification Search
USPC .......... 361/69–712, 715, 719; 165/80.2, 80.3, 165/80.4, 80.5, 104.14, 104.19, 104.33, 165/104.34, 185; 174/15.1, 16.3, 252; 257/706–727
See application file for complete search history.

(56) References Cited

U.S. PATENT DOCUMENTS

| | | | |
|---|---|---|---|
| 4,561,011 A * | 12/1985 | Kohara et al. | 257/713 |
| 5,089,936 A * | 2/1992 | Kojima et al. | 361/705 |
| 5,097,387 A * | 3/1992 | Griffith | 361/699 |
| 5,289,337 A * | 2/1994 | Aghazadeh et al. | 361/718 |
| 5,396,403 A * | 3/1995 | Patel | 361/705 |
| 5,471,366 A * | 11/1995 | Ozawa | 361/704 |
| 5,931,222 A * | 8/1999 | Toy et al. | 165/80.3 |
| 6,212,074 B1 * | 4/2001 | Gonsalves et al. | 361/717 |
| 6,563,712 B2 * | 5/2003 | Akram et al. | 361/719 |
| 6,639,799 B2 * | 10/2003 | Prasher et al. | 361/700 |
| 6,680,532 B1 * | 1/2004 | Miller et al. | 257/723 |
| 7,031,162 B2 * | 4/2006 | Arvelo et al. | 361/718 |
| 7,094,459 B2 * | 8/2006 | Takahashi | 428/68 |
| 7,254,033 B2 * | 8/2007 | Jafari et al. | 361/719 |
| 7,443,686 B2 * | 10/2008 | Kuo et al. | 361/719 |
| 7,477,520 B2 * | 1/2009 | Shibamoto et al. | 361/719 |
| 7,816,785 B2 * | 10/2010 | Iruvanti et al. | 257/707 |
| 8,081,473 B2 * | 12/2011 | Cipolla et al. | 361/719 |
| 8,179,678 B2 * | 5/2012 | Yamashita et al. | 361/715 |
| 2003/0128518 A1 * | 7/2003 | Gaynes et al. | 361/704 |
| 2003/0203181 A1 * | 10/2003 | Ellsworth et al. | 428/307.3 |
| 2004/0179339 A1 * | 9/2004 | Mayer | 361/704 |
| 2005/0068739 A1 * | 3/2005 | Arvelo et al. | 361/718 |
| 2007/0152321 A1 * | 7/2007 | Shi et al. | 257/704 |
| 2008/0142954 A1 * | 6/2008 | Hu | 257/713 |
| 2009/0019411 A1 * | 1/2009 | Chandra et al. | 716/9 |
| 2010/0181663 A1 * | 7/2010 | Iruvanti et al. | 257/713 |

FOREIGN PATENT DOCUMENTS

| | | | |
|---|---|---|---|
| JP | 406177320 A | * | 6/1994 |
| JP | 2003-068943 A | | 3/2003 |

* cited by examiner

*Primary Examiner* — Michail V Datskovskiy
(74) *Attorney, Agent, or Firm* — Volpe And Koenig, P.C.

(57) ABSTRACT

A cooling structure for electronic equipment includes a plurality of cooling structural members on a same substrate. In the cooling structural members, a plurality of heating components having a same shape are connected to one thermal diffusion part through a first thermal conductive member. Each of thermal diffusion parts of the plurality of cooling structural members is connected to one heat dissipator through a second thermal conductive member.

8 Claims, 2 Drawing Sheets

COOLING STRUCTURE FOR ELECTRONIC EQUIPMENT

INCORPORATION BY REFERENCE

The present application claims priority from Japanese application JP 2010-061782 filed on Mar. 18, 2010, the content of which is hereby incorporated by reference into this application.

BACKGROUND OF THE INVENTION (1) Field of the Invention

The present invention relates to a cooling structure for cooling a plurality of heating elements having different heights.

(2) Description of the Related Art

The miniaturization and high integration have been rapidly advanced for semiconductors used in electronic equipments, especially for semiconductors represented by CPUs of information processing equipments. Accordingly, the amount of heat generation has been increasing. However, as general characteristics of the semiconductors, there is the problem that the semiconductors are vulnerable to heat, and when the semiconductors are used at a high temperature, their reliability is significantly reduced. Therefore, in order to ensure the cooling performance of the semiconductors, the sizes of the heatsinks mounted on the semiconductors tend to be large as compared with the conventional ones.

Further, in recent years, along with the enhancement in the performance of CPUs, the amount of heat generation of the power supply components for stably supplying electric power to the components of the CPUs, especially MOS-FETs, regulator components, and the like which are mounted on the substrates have been dramatically increased. In general, a plurality of these components are mounted for each kinds of power supplies. The amount of heat generation of each component is small as compared with a CPU. However, since the component areas are very small, the heating density of these components is comparable to an LSI of several tens of watts. Further, in these components, the component temperature and the substrate temperature are substantially the same due to their mounting structure. Accordingly, cooling the power supply components becomes essential in order to ensure the reliability of the substrate.

BRIEF SUMMARY OF THE INVENTION

There is a solution for the above described problem, which is to mount a heatsink in order to enlarge the heat radiation area. However, these power supply components are mounted so close together that the heatsinks interfere with each other if the sizes of the heatsinks are designed to meet the thermal spec. Further, the sizes of these power supply components are very small. Taking into consideration that the adhesion area is small, it is difficult to fix the heatsink with a thermal conductive adhesive agent, a double sided adhesive tape, or the like. Therefore, in order to mount the heatsink, through-holes are provided in the substrate, and the heatsink is fixed with screws, push pins, or the like. However, providing the through-holes causes the problem that the wiring design in the substrate is extremely limited.

Further, when a heating element generating large amount of heat, such as a CPU, and power supply components for supplying power to the CPU, are mounted on the substrate, the power supply components are tend to be arranged near the CPU in many cases. Therefore, when a CPU heatsink is mounted, it is difficult to ensure the heat radiation area necessary for cooling the power supply components.

As for the method for solving such a problem, for example, JP-A-2003-68943 discloses to enlarge the heat radiation area with a heat spreader which spreads the heat generated by the heating elements.

As an example, collective cooling of a CPU and a plurality of heating components supplying power to the CPU is described. As described above, the CPU cooling heatsink tends to increase in size, and the heatsink is therefore enlarged into a space above the heating components at the peripheral portion. Thus, by focusing on this point, the cooling structures were considered in which the heat generated by the heating component is transferred to the side of the heatsink for cooling the CPU, and the heat is cooled integrally with the CPU.

The first idea of the method is that a material (thermal conductive sheet or the like) having heat conductivity is mounted between the heating element and the heatsink for cooling the CPU, and the difference in height between the CPU and the heating element is absorbed with the thermal conductive sheet. The heat generated by the heating element is transferred to the heatsink through the thermal conductive sheet. This structure is the simplest. However, a CPU is generally configured by a plurality of electromechanical components such as a socket, and therefore, has a large component height as compared with the other heating elements. Therefore, a very thick sheet is required to absorb the height difference. This is not realistic. Further, the temperature rise in the sheet portion becomes very high.

The second idea of the method is that the base of the heatsink for a CPU is formed into a pedestal shape only at the periphery of the heating element, and thereby, the heatsink is brought into contact with the heating element through a thermal conductive sheet. The thickness of the thermal conductive sheet decreases as compared with the first idea. However, since the sheet thickness is influenced by the height tolerance of the CPU, the sheet thickness cannot be made smaller than the tolerance. Further, similarly to the first idea, the contact area between the heating element and the thermal conductive sheet is the same size as the chip. Therefore, the temperature rise in this portion becomes large, and the problem remains in view of the cooling performance for the heating element.

In order to solve the above described problems, a cooling structure according to the present invention includes a thermal diffusion part for cooling a plurality of heating elements having the same shape, and thermally connects the heating elements to the thermal diffusion part through a thermal conductive sheet 1. Further, one or more thermal diffusion parts are similarly provided for a plurality of heating elements having one or more different shapes which have different sizes and heights from the aforementioned heating elements. Thereby, the heat generated by the heating elements is diffused. These thermal diffusion parts are connected to one heat dissipator through another thermal conductive sheet 2. The cooling structure is provided which finally radiates the heat generated by the heating elements through one heat dissipator.

By adopting this structure, the tolerances of the components are absorbed by the thermal conductive sheets between the heat dissipator and the thermal diffusion parts, and the heat generated by each component can be cooled by the integral heat dissipator. Although the thickness of the thermal conductive sheet 2 becomes large, the contact area with the heat dissipator can be enlarged by employing the thermal diffusion part. Therefore, the temperature rise in this portion can be suppressed. Further, the thermal conductive sheet 1 is irrelevant to the tolerances of the aforementioned components. Therefore, the thickness of the thermal conductive sheet can be made small, and the temperature rise in this portion can be suppressed.

By using the cooling structure of the present invention, the heat radiation area necessary for cooling the heating elements can be ensured without interference of the heat dissipator. Further, the temperature rise of the thermal conductive sheet can be reduced, and the reliability of the substrate can be ensured by the improvement in the cooling performance of the heating element. Further, by using the integral heat dissipator, the number of through-holes can be made as small as possible. Therefore, the wiring design in the substrate can be facilitated.

Other objects, features and advantages of the invention will become apparent from the following description of the embodiments of the invention taken in conjunction with the accompanying drawings.

DETAILED DESCRIPTION OF THE INVENTION

Hereinafter, embodiments of the present invention are described in detail with reference to the accompanying drawings.

Embodiment 1

Figure 1:
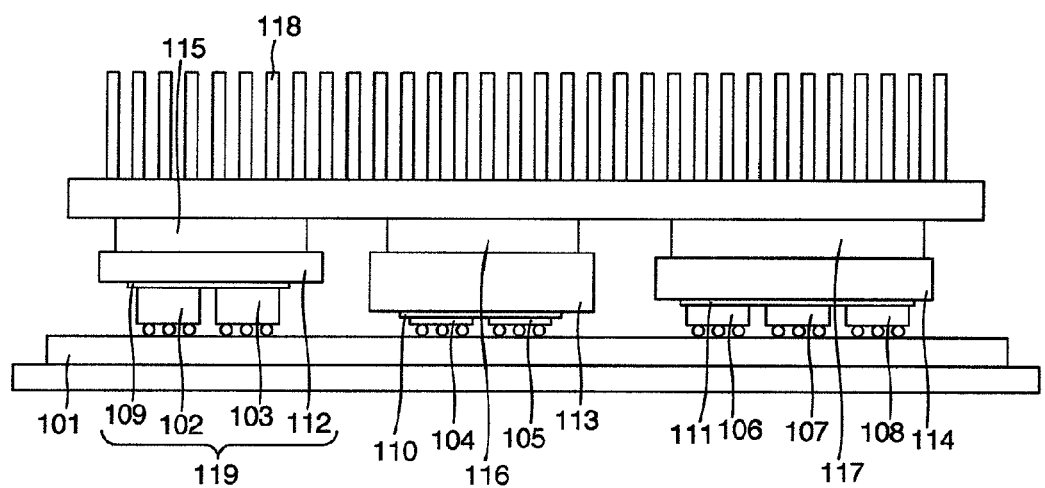
FIG. 1 is a configuration diagram of a cooling structure according to a first embodiment of the present invention, which cools a plurality of cooling structural members having different size and height with one heat dissipator.
Figure 2:
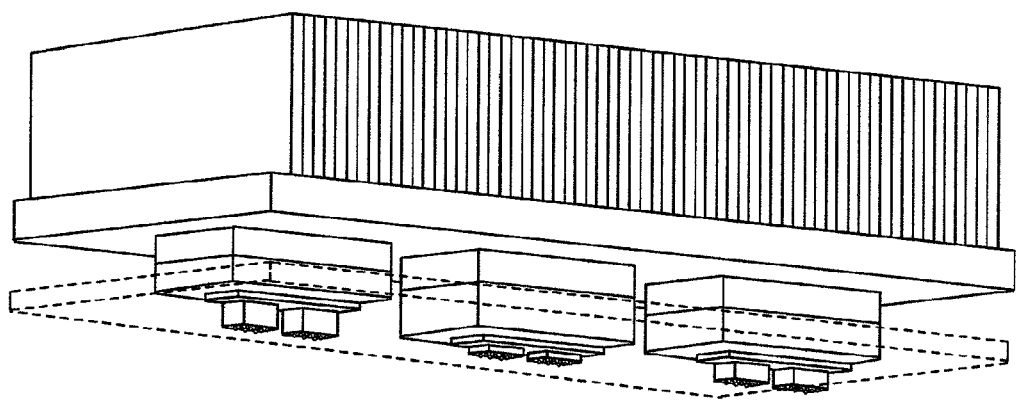
FIG. 2 is a perspective view of the first embodiment of the present invention.

FIG. 1 shows a first embodiment of a cooling structure according to the present invention, which cools a plurality of cooling structural members having different size and height with one heat dissipator. FIG. 2 is a perspective view of the first embodiment. Heating elements 102 to 108 are mounted on a substrate 101. These heating elements are divided into three groups, i.e. 102 and 103, 104 and 105, and 106 to 108.

The heating elements in the same group have the same shape. However, those in the different groups totally differ in size and height. The heat generated by the heating elements belonging to the same group, i.e. 102 and 103, 104 and 105, or 106 to 108, is respectively transferred to thermal diffusion parts 112 to 114 for diffusing heat through respective thermal conductive sheets 109 to 111. The heat diffused by the heat diffusion parts 112 to 114 is transferred to a heat dissipator 118 through respective thermal conductive sheets 115 to 117. Thereby, the heating elements 102 to 108 and the heat dissipator 118 are brought into a thermally connected state, and the heat generated by the heating elements can be cooled collectively in the heat dissipator. Considering the good contact under loaded condition between the respective heat diffusion parts 112 to 114 and the heat dissipator 118, the heights of the heat diffusion parts 112 to 114 are preferably equal.

In order to suppress the temperature rise of the heating elements, it is important to suppress the temperature rise occurring in the thermal conductive sheet portion. A temperature rise $\Delta T$ can be calculated by multiplying a heating value Q of the heating element by a thermal resistance R. Here, the thermal resistance R represents the resistance against heat transfer, and is expressed by the equation of $R = t \div (\lambda \times A)$. Here, t represents a thickness (mm) of the object, $\lambda$ represents a thermal conductivity (W/mK) of the object, and A represents a heat transfer sectional area ($mm^2$). As a result, it is found that the thermal resistance R is proportional to t and is inversely proportional to A. Therefore, in order to decrease the value of $\Delta T$, it is necessary to decrease the thickness t or increase the heat transfer sectional area A.

For example, the case of cooling collectively conducted with a CPU 119 is described. The thicknesses of the thermal conductive sheets 115 to 117 have to be not less than the range of the tolerance of the height dimension of the CPU 119. Therefore, the thickness t of this portion becomes large. However, the temperature rise of this portion can be suppressed, since the contact area A is enlarged by the thermal diffusion part. The shape of the thermal diffusion part is a plate-shape or a block-shape. The material having excellent thermal conductivity, such as copper or the like, is used.

Further, by adopting this structure, the thicknesses of the thermal conductive sheets 109 to 111 between the heating elements and the thermal diffusion part become irrelevant to the tolerance of the height dimension of the CPU 119. Therefore, as for the sheet thickness of this portion, only the tolerances of the height dimensions of the heating elements have to be considered. Therefore, the sheet thickness t can be made extremely small, while the contact area A is small. And also, the temperature rise in this portion can be suppressed. Although there is the disadvantage of increasing the kind of the thermal conductive sheet, the thickness of the thermal conductive sheets between the heating elements and the heat diffusion parts can be made small which have small areas and tend to have a temperature difference. Also, the thermal conductive sheet area between the thermal diffusion parts and the heat dissipator can be enlarged. Accordingly, the temperature rise in the entire thermal conductive sheet portion can be suppressed as a result, and the cooling performance can be consequently improved. In regard with the method for fixing the thermal diffusion parts 112 to 114 and the heat dissipator 118, there are some methods in which holes are provided in the substrate and the thermal diffusion parts and the heat dissipator are fixed with screws, push pins, or the like.

Embodiment 2

Figure 3:
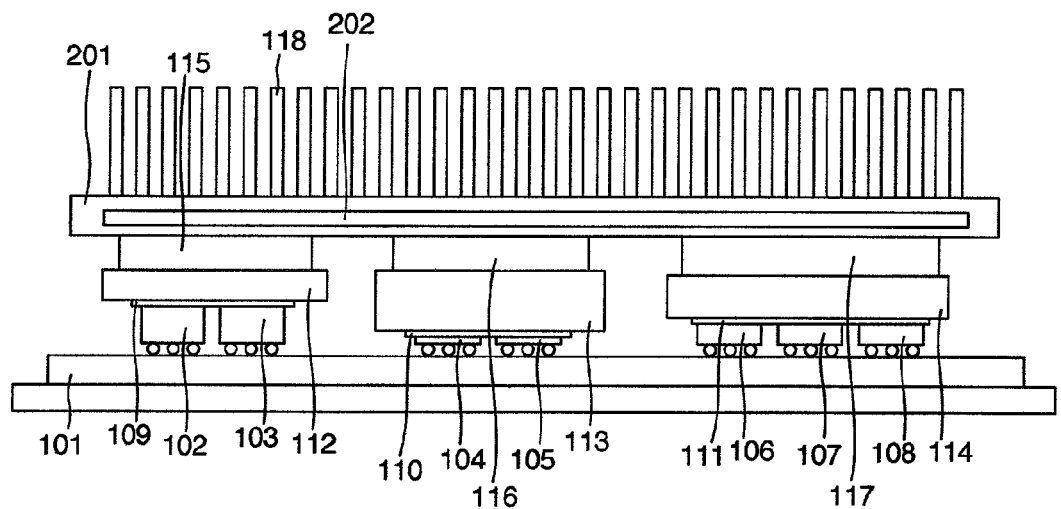
FIG. 3 is a configuration diagram of a cooling structure according to a second embodiment of the present invention, which cools a plurality of cooling structural members having different size and height with one heat dissipator.

FIG. 3 shows a second embodiment of the cooling structure according to the present invention, which cools a plurality of cooling structural members having different sizes and heights with one heat dissipator. Compared to embodiment 1, a flat plate heat pipe 202 is used for a base portion 201 of the heat dissipator 118 in order to promote thermal diffusion to the entire heat dissipator 118. As a result, the cooling performance of the heating element itself can be improved and the temperature in the heatsink exhaust side can be made constant, which leads to reduction in temperature of an LSI mounted downstream.

Embodiment 3

Figure 4:
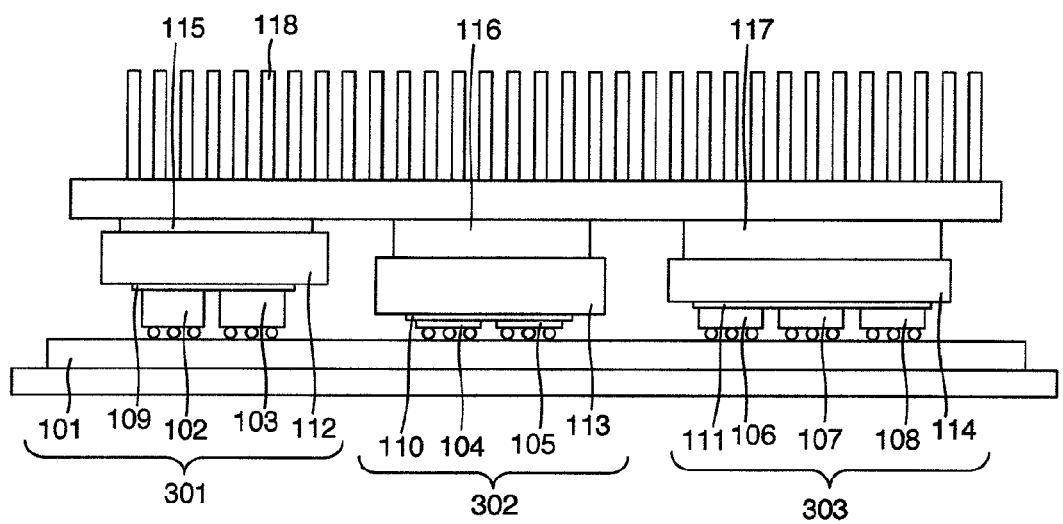
FIG. 4 is a configuration diagram of a cooling structure according to a third embodiment of the present invention, which cools a plurality of cooling structural members having different size and height with one heat dissipator.

FIG. 4 shows a third embodiment of the cooling structure according to the present invention, which cools a plurality of cooling structural members having different sizes and heights with one heat dissipator. The cooling structural member 301 is comprised of the heating elements 102 to 103, the thermal conductive sheet 109 and the thermal diffusion part 112. The cooling structural member 302 is comprised of the heating elements 104 and 105, the thermal conductive sheet 110 and the thermal diffusion part 113. The cooling structural member 303 is comprised of the heating elements 106 to 108, the thermal conductive sheet 111 and the thermal diffusion part 114. The cooling structural member 303 transfers heat to the heat dissipator 118 through the thermal conductive sheet 117. In order to ensure the heat transfer, the thickness of the thermal conductive sheet 117 needs to be made larger than the maximum tolerance value of the height dimension of the cooling structural member 303. Meanwhile, the thermal conductive sheet 111 is not influenced by the tolerance of the cooling structural member 303. Only the tolerances of the heating elements 106 to 108 having the same shape have to be considered. Therefore, the thermal conductive sheet 111 can be made sufficiently thin as compared with the thermal conductive sheet 117. For example, when the structural member 301 is a CPU, the tolerance from the substrate bottom surface to the top surface of the CPU 301 is about ±0.5 mm. Therefore, taking into consideration the compression rate and the like, the thermal conductive sheet 117 needs to have a thickness of 1.5 mm or more. Meanwhile, the thermal conductive sheet 111 only have to have a thickness of 0.3 mm or more, since only the tolerances of a plurality of components having the same shape have to be considered. The feature of FIG. 4 is that the thickness of the thermal conductive sheet 117 is larger than the total value of the tolerances of the CPU 301, and the thermal conductive sheet 111 is thinner than the thermal conductive sheet 117. FIG. 4 differs from FIG. 1 in this point.

The temperature rise in the thermal conductive sheet is inversely proportional to the value of the thermal conductivity as described above. Therefore, the sheet with a high thermal conductivity needs to be selected. Further, many components are restricted in the upper limit of load. Therefore, the sheet having excellent compression characteristic needs to be selected so as to have a predetermined thickness with small load. When cooling performance is also taken into consideration, the sheet preferably has a thermal conductivity of 3 (W/mK), and a compressibility of 30% or more under load of 0.3 (MPa). As a concrete example, there are some methods for achieving a good balance between the compression characteristic and the high thermal conductivity by the combination of silicon rubber and carbon fiber.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A cooling structure for electronic equipment, comprising a plurality of cooling structural members on a same substrate, wherein each of the plurality of the cooling structural members comprises a plurality of heating elements having a same shape, one thermal diffusion part, and a first thermal conductive sheet connecting the plurality of heating elements to the thermal diffusion part, wherein the thermal diffusion parts of each of the plurality of cooling structural members is connected to one heat dissipator through a second thermal conductive sheet, and wherein the second thermal conductive sheet has elasticity and is independently provided for the thermal diffusion part of each of the plurality of cooling structural members.

2. The cooling structure according to claim 1, wherein a flat plate heat pipe is used inside the heat dissipator.

3. The cooling structure according to claim 1, wherein each of second thermal conductive sheets provided between the respective cooling structural members and the heat dissipator is thicker than a maximum tolerance value of a height dimension of the respective cooling structural members.

4. The cooling structure according to claim 1, wherein the first thermal conductive sheet of each of the cooling structural members is thinner than respective second thermal conductive sheets provided between the respective cooling structural members and the heat dissipator.

5. The cooling structure according to claim 1,
wherein when one of the plurality of cooling structural members is replaced with a CPU, each of second thermal conductive sheets provided between the respective cooling structural members other than the CPU and the heat dissipator is thicker than a maximum tolerance of a height dimension of the CPU.

6. The cooling structure according to claim 5,
wherein the first thermal conductive sheet of each of the cooling structural members other than the CPU is thinner than the respective second thermal conductive sheets.

7. The cooling structure according to claim 1,
wherein the second thermal conductive sheet has a compressibility of 30% or more under load of 0.3 (MPa).

8. The cooling structure according to claim 1,
wherein the second thermal conductive sheet is composed of the combination of silicon rubber and carbon fiber.

* * * * *